United States Patent
Fu

(10) Patent No.: US 11,044,813 B2
(45) Date of Patent: Jun. 22, 2021

(54) ALL-DIRECTIONS EMBEDED MODULE, METHOD FOR MANUFACTURING THE ALL-DIRECTIONS EMBEDED MODULE, AND ALL-DIRECTIONS PACKAGING STRUCTURE

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/713,400

(22) Filed: Dec. 13, 2019

(65) Prior Publication Data
US 2021/0120674 A1    Apr. 22, 2021

(30) Foreign Application Priority Data
Oct. 21, 2019    (CN) .......................... 201911002167.0

(51) Int. Cl.
*H05K 3/46*    (2006.01)
*H05K 3/42*    (2006.01)
(Continued)

(52) U.S. Cl.
CPC ............. *H05K 1/186* (2013.01); *H05K 1/113* (2013.01); *H05K 3/421* (2013.01); *H05K 3/429* (2013.01);
(Continued)

(58) Field of Classification Search
CPC .......... H05K 3/4697; H05K 3/30; H05K 3/42; H05K 3/4038; H05K 3/421; H05K 3/429;
(Continued)

(56) References Cited

U.S. PATENT DOCUMENTS 6,590,291 B2 * 7/2003 Akagawa ............ H01L 23/3121
257/686
6,991,966 B2 * 1/2006 Tuominen ........... H01L 23/5389
257/E23.178
(Continued)

FOREIGN PATENT DOCUMENTS

TW    201434358 A    9/2014
TW    201507556 A    2/2015

*Primary Examiner* — Peter Dungba Vo
*Assistant Examiner* — Kaying Kue
(74) *Attorney, Agent, or Firm* — ScienBiziP, P.C.

(57) ABSTRACT

An all-directions embedded module includes a substrate layer, many first embedded pads, many second embedded pads, and many side wall circuits. The substrate layer comprises a first surface, a second surface opposite to the first surface, and a plurality of side surfaces connected to the first surface and the second surface. The first embedded pads is formed on the first surface. The second embedded pads is formed on the second surface. The side wall circuits embedded in the substrate layer and exposed from the side surfaces. The all-directions embedded module further includes a plurality of first connecting circuits formed on the first surface and a plurality of second connecting circuits formed on the second surface. The first embedded pads is connected to the side wall circuits by the first connecting circuits. The second embedded pads is connected to the side wall circuits by the second connecting circuits.

7 Claims, 12 Drawing Sheets

(51) Int. Cl.
 *H05K 1/18* (2006.01)
 *H05K 1/11* (2006.01)
(52) U.S. Cl.
 CPC . *H05K 3/4611* (2013.01); *H05K 2201/09409* (2013.01); *H05K 2201/09509* (2013.01); *H05K 2203/0228* (2013.01)
(58) Field of Classification Search
 CPC .... H05K 3/4644; H05K 3/4652; H05K 1/186; H05K 1/113; H05K 2201/09509; H05K 2201/09409; H05K 2203/0228; Y10T 29/49155; Y10T 29/49165; Y10T 29/4913; Y10T 29/49146
 USPC ............................ 29/852, 846, 848, 832, 841
 See application file for complete search history.

(56) References Cited

U.S. PATENT DOCUMENTS

| | | | | |
|---|---|---|---|---|
| 7,145,228 B2* | 12/2006 | Yean | H01L 24/97 | 257/698 |
| 7,286,366 B2* | 10/2007 | Zollo | H05K 1/184 | 361/761 |
| 7,350,296 B2* | 4/2008 | Ryu | H05K 1/185 | 29/852 |
| 7,352,054 B2* | 4/2008 | Jobetto | H01L 24/97 | 257/673 |
| 7,379,306 B2* | 5/2008 | Sawatari | H01L 23/142 | 361/761 |
| 7,550,320 B2* | 6/2009 | Wang | H05K 1/186 | 438/125 |
| 7,730,612 B2* | 6/2010 | Park | H01L 24/82 | 29/837 |
| 7,745,737 B2* | 6/2010 | Lin | H05K 1/0216 | 174/262 |
| 7,969,745 B2* | 6/2011 | Hsu | H01L 24/19 | 361/761 |
| 8,099,865 B2* | 1/2012 | Wang | H01L 24/82 | 29/830 |
| 8,320,134 B2* | 11/2012 | Su | H01L 25/105 | 361/761 |
| 8,578,598 B2* | 11/2013 | Chen | H01L 24/20 | 29/831 |
| 9,462,697 B2* | 10/2016 | Chung | H05K 1/186 | |
| 9,706,663 B2* | 7/2017 | Sakamoto | H01L 23/5385 | |
| 9,894,779 B2* | 2/2018 | Fu | H05K 1/188 | |
| 9,984,979 B2* | 5/2018 | Park | H01L 23/5384 | |
| 10,039,184 B2* | 7/2018 | Wu | H05K 3/0044 | |
| 10,187,984 B1* | 1/2019 | Hou | H05K 3/06 | |
| 10,219,366 B1* | 2/2019 | Tseng | H05K 1/0237 | |
| 10,561,017 B1* | 2/2020 | Fu | H05K 1/0298 | |
| 10,757,817 B2* | 8/2020 | Fu | H05K 1/185 | |
| 2003/0029830 A1* | 2/2003 | Takaya | H01F 41/041 | 216/13 |
| 2003/0178229 A1* | 9/2003 | Toyoda | H05K 3/4688 | 174/261 |
| 2006/0108144 A1* | 5/2006 | Shizuno | H01L 24/19 | 174/255 |
| 2006/0152329 A1* | 7/2006 | Bjorsell | H01C 1/148 | 338/22 R |
| 2007/0190764 A1* | 8/2007 | Jung | H01L 21/481 | 438/584 |
| 2007/0278644 A1* | 12/2007 | Hsu | H05K 1/186 | 257/686 |
| 2008/0041619 A1* | 2/2008 | Lee | H01L 24/24 | 174/260 |
| 2008/0251908 A1* | 10/2008 | Yang | H01L 23/3121 | 257/690 |
| 2009/0075457 A1* | 3/2009 | Machida | H01L 24/11 | 438/462 |
| 2009/0107702 A1* | 4/2009 | Samejima | H05K 3/445 | 174/254 |
| 2009/0140394 A1* | 6/2009 | Bathan | H01L 23/3107 | 257/621 |
| 2010/0163168 A1* | 7/2010 | Saita | H01L 23/49827 | 156/247 |
| 2010/0236817 A1* | 9/2010 | Chen | H01L 25/105 | 174/257 |
| 2011/0048780 A1* | 3/2011 | Jeong | H01L 24/82 | 174/260 |
| 2012/0186866 A1* | 7/2012 | Mikado | H05K 3/4602 | 174/260 |
| 2012/0227261 A1* | 9/2012 | Inui | H05K 1/0206 | 29/849 |
| 2012/0287586 A1* | 11/2012 | Mikado | H01L 23/49822 | 361/748 |
| 2013/0020120 A1* | 1/2013 | Ishihara | H05K 3/4697 | 174/262 |
| 2013/0025925 A1* | 1/2013 | Naganuma | H05K 3/4694 | 174/262 |
| 2014/0124474 A1* | 5/2014 | You | H05K 3/007 | 216/13 |
| 2014/0182892 A1* | 7/2014 | Hsu | H05K 3/4697 | 174/251 |
| 2015/0040389 A1* | 2/2015 | Ishiguro | H05K 1/185 | 29/832 |
| 2015/0062848 A1* | 3/2015 | Lee | H05K 1/0271 | 361/761 |
| 2015/0136449 A1* | 5/2015 | Yamashita | H01G 2/10 | 174/251 |
| 2015/0138741 A1* | 5/2015 | Moon | H01L 24/19 | 361/762 |
| 2015/0223341 A1* | 8/2015 | Kim | H05K 1/185 | 361/761 |
| 2015/0359103 A1* | 12/2015 | Sano | H01L 23/13 | 361/761 |
| 2018/0213647 A1* | 7/2018 | Gavagnin | H05K 3/30 | |
| 2020/0120805 A1* | 4/2020 | Li | H05K 3/4611 | |

\* cited by examiner

US 11,044,813 B2

ALL-DIRECTIONS EMBEDED MODULE, METHOD FOR MANUFACTURING THE ALL-DIRECTIONS EMBEDED MODULE, AND ALL-DIRECTIONS PACKAGING STRUCTURE

FIELD

The present disclosure relates to an all-directions embedded module, a method for manufacturing the all-directions embedded module, and an all-directions packaging structure.

BACKGROUND

Electronic devices may have circuit boards. When the electronic device becomes lighter and thinner, passive components may be embedded in the circuit boards to save space. The embedded passive component includes an inductor component, a capacitor component, a resistor component, or the like. A method for embedding the embedded passive components in the circuit boards may be: placing the passive components horizontally in cavities, and then adding more layers. The embedded passive components cannot achieve an all-directions conduction in a packaging structure, which will limit package flexibility and paths of a signal transmission, and will increase packaging processes of manufacturing a packaging structure.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION OF EMBODIMENTS

Figure 1:
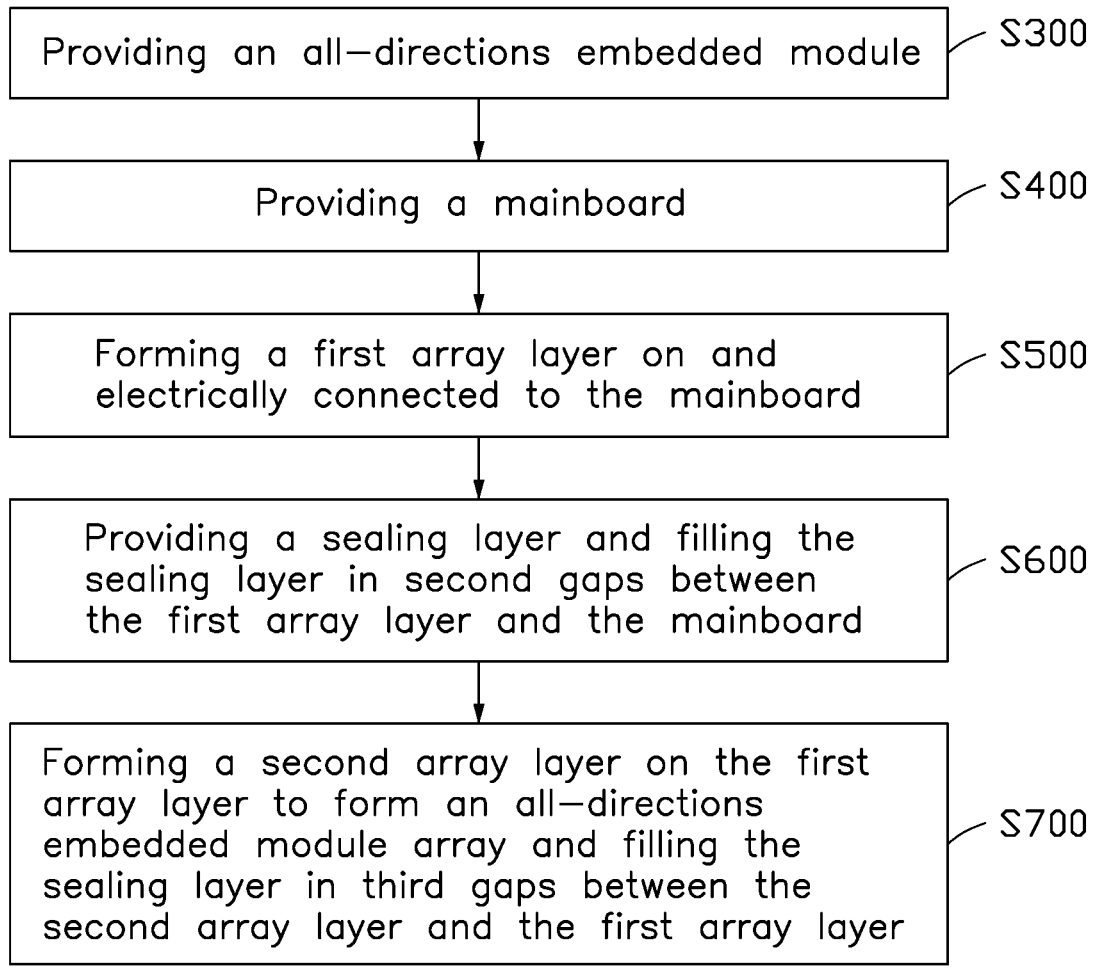
FIG. 1 is a flowchart of a method for manufacturing an all-directions packaging structure in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 illustrates a flow chart of a method for manufacturing an all-directions packaging structure in accordance with an embodiment of the present disclosure. The example method is provided by way of example, as there are a variety of ways to carry out the method. The method described below can be carried out using the configurations illustrated in FIGS. 2-19, for example, and various elements of these figures are referenced in explaining example method. Each block shown in FIG. 1 represents one or more processes, methods, or subroutines, carried out in the example method. Additionally, the illustrated order of blocks is by example only and the order of the blocks can change. The example method can begin at block 300.

At block 300, referring to FIGS. 2-12, an all-directions embedded module 10 is provided.

Figure 2:
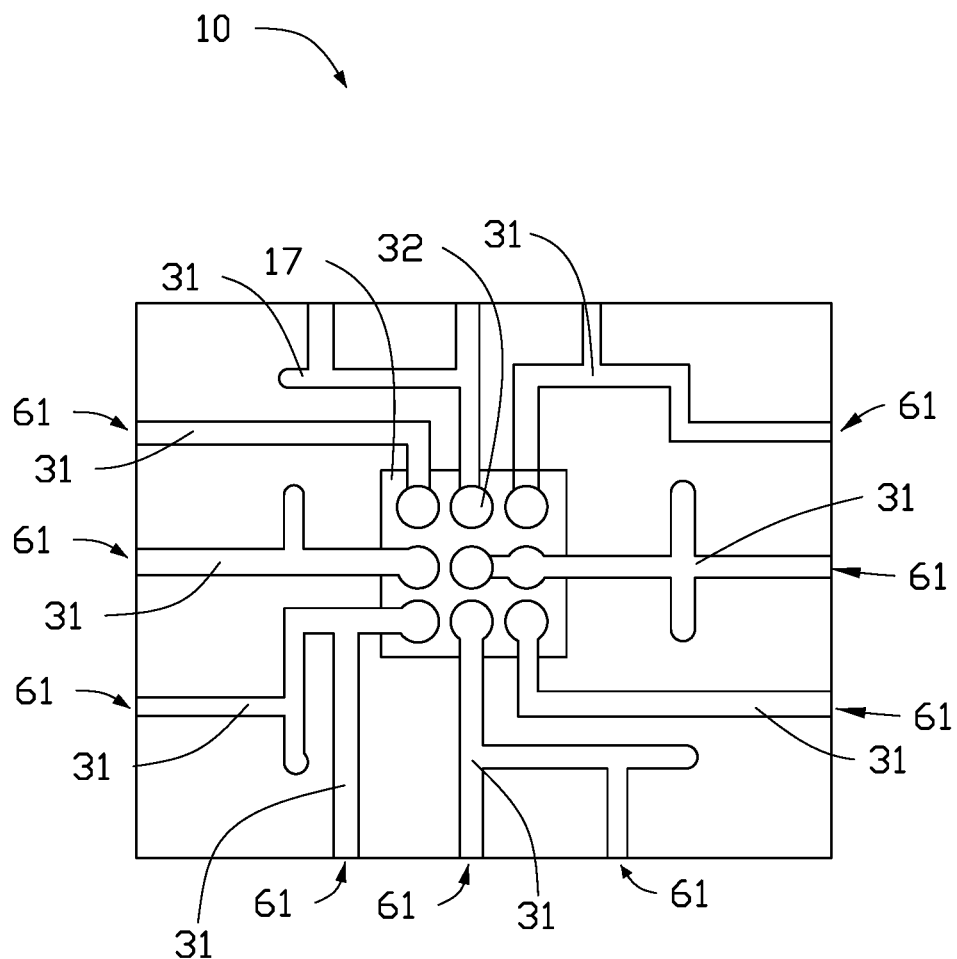
FIG. 2 is a plan view of an exemplary embodiment of an all-directions embedded module according to the present disclosure.
Figure 3:
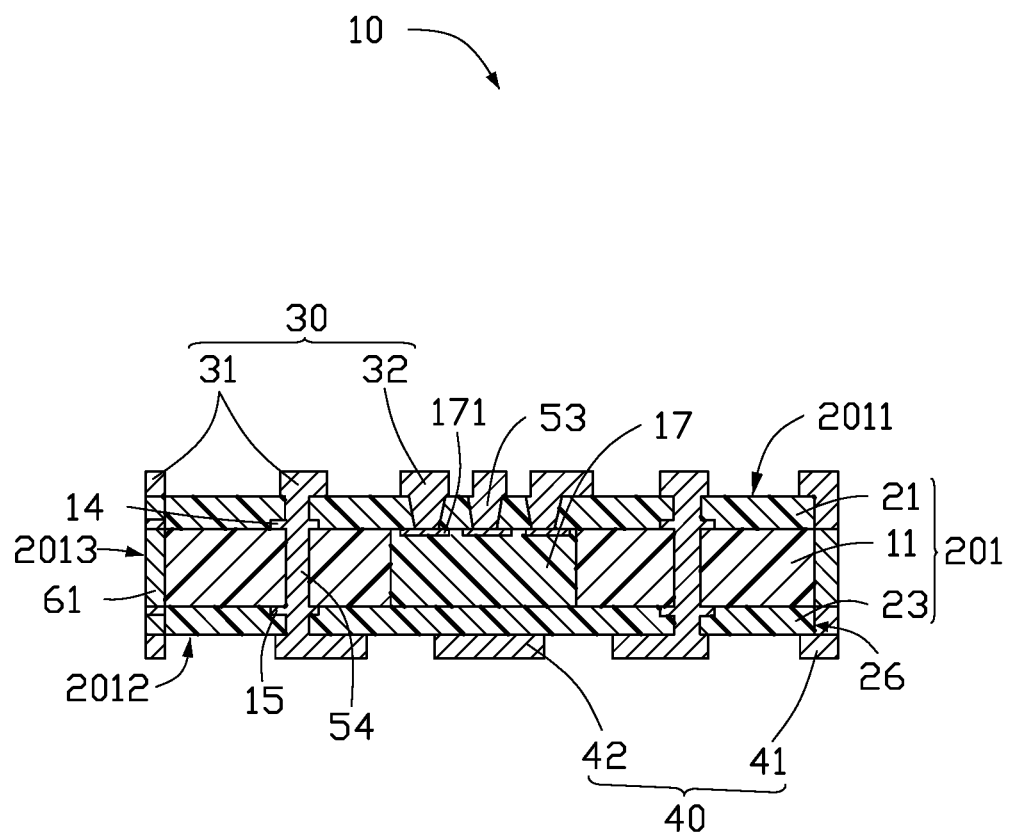
FIG. 3 is a cross-sectional view of the all-directions embedded module of FIG. 2 along line II-II.
Figure 4:
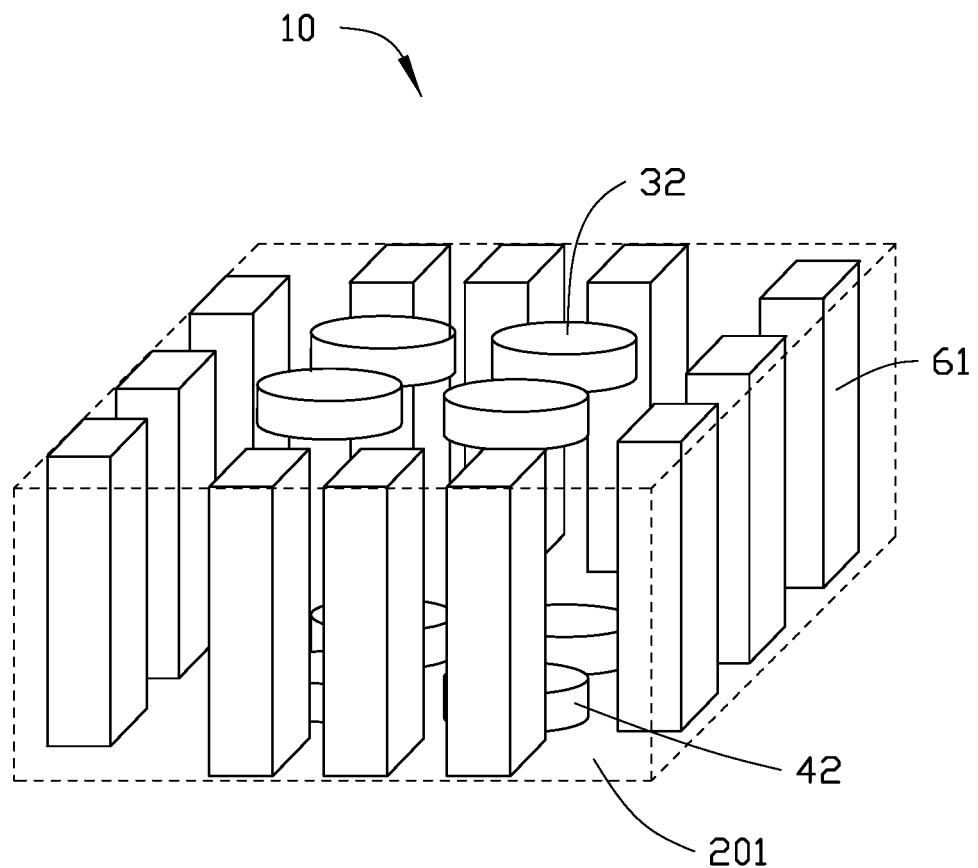
FIG. 4 is a perspective view of the all-directions embedded module (only with side wall circuits and a parts of welding pads) of FIG. 2.

FIGS. 2-4 showing an all-directions embedded module 10, the all-directions embedded module 10 includes a substrate layer 201, at least one electronic element 17, a first outer circuit layer 30, a second outer circuit layer 40, and a plurality of side wall circuits 61.

The substrate layer 201 includes a first surface 2011, a second surface opposite to the first surface 2012, and a plurality of side surfaces 2013 connected to the first surface 2011 and the second surface 2012. The component 17 is embedded in the substrate layer 201. The first outer circuit layer 30 is formed on the first surface 2011. The second outer circuit layer 40 is formed on the second surface 2012. The plurality of side wall circuits 61 is embedded in the substrate layer 201 and exposed from the plurality of side surfaces 2013. The plurality of side wall circuits 61 surrounds the component 17.

The substrate layer 201 further includes a second dielectric layer 21, a first dielectric layer 11, and a third dielectric layer 23 successively stacked together. The component 17 is received in the first dielectric layer 11. The second dielectric layer 21 and the third dielectric layer 23 are respectively formed on two opposite surfaces of the first dielectric layer 11. The second dielectric layer 21 and the third dielectric layer 23 cover the component 17. The first dielectric layer 11 matches the second dielectric layer 21 and the third dielectric layer 23 to embed the component 17 in the substrate layer 201.

The component 17 has a plurality of electrodes 171.

The first outer circuit layer 30 includes a plurality of first connecting circuits 31 and a plurality of first embedded pads 32. In at least one embodiment, the plurality of first embedded pads 32 is connected to the plurality of side wall circuits 61 by the plurality of first connecting circuits 31. The plurality of first embedded pads 32 is connected to the component 17.

The second outer circuit layer 40 includes a plurality of second connecting circuits 41 and a plurality of second embedded pads 42. The plurality of second embedded pads 42 is connected to the plurality of side wall circuits 61 by the plurality of second connecting circuits 41.

The all-directions embedded module 10 further includes a plurality of third conductive holes 53 and a plurality of fourth conductive holes 54. The first outer circuit layer 30 is connected to the second outer circuit layer 40 by the plurality of fourth conductive holes 54. In detail, the plurality of first connecting circuits 31 is connected to the plurality of second embedded pads 42 by the plurality of fourth conductive holes 54. The plurality of first embedded pads 32 is connected to the plurality of electrodes 171 of the component 17 by the plurality of third conductive holes 53.

The all-directions embedded module 10 further includes a first inner circuit layer 14 and a second inner circuit layer 15. The first inner circuit layer 14 and the second inner circuit layer 15 are respectively formed on two opposite surfaces of the first dielectric layer 11 and embedded in the second dielectric layer 21 and the third dielectric layer 23.

Figure 5:
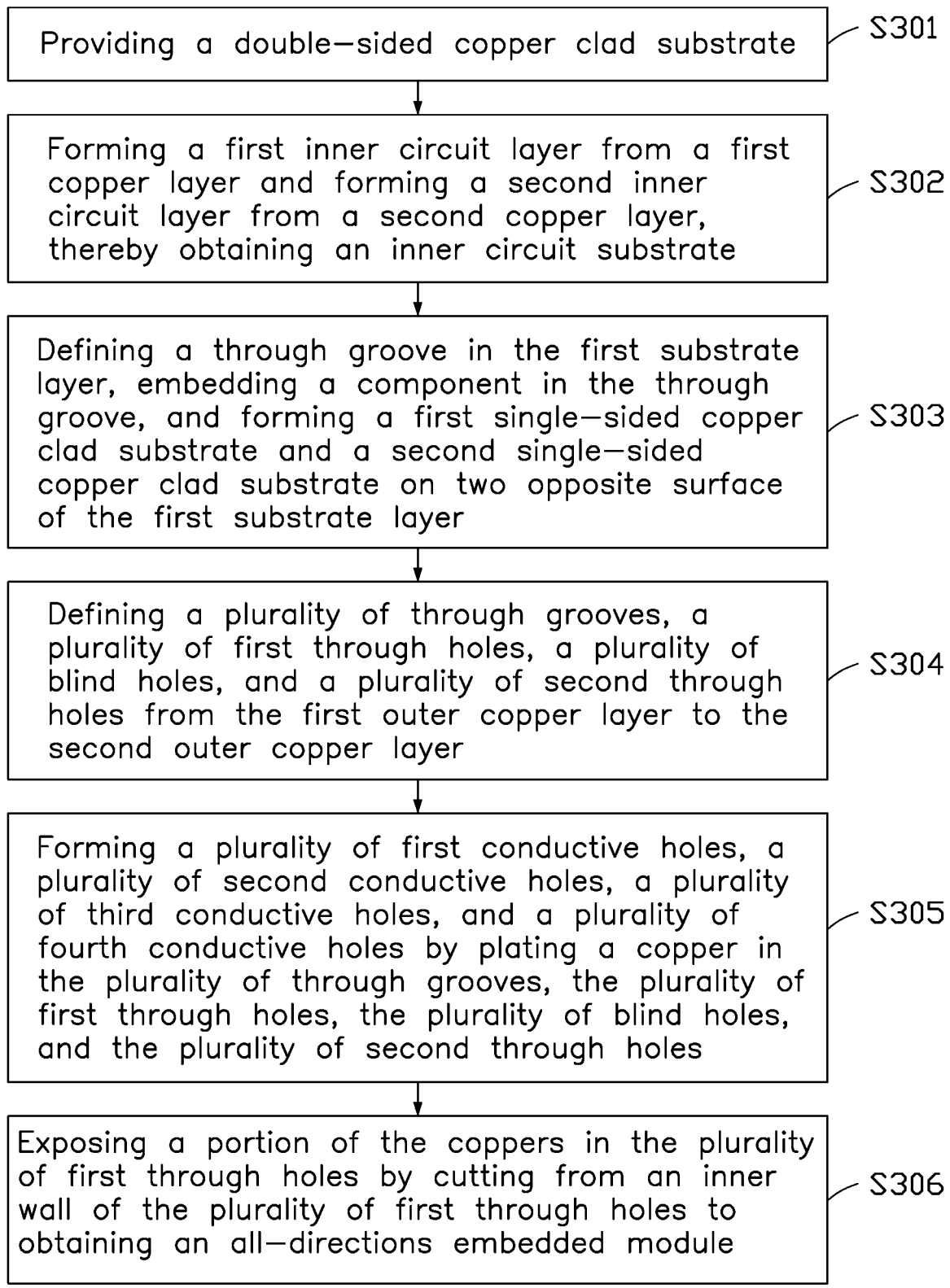
FIG. 5 is a flowchart of a method for manufacturing the all-directions embedded module of FIG. 4 in accordance with an embodiment.

FIG. 5 illustrates a flow chart of a method for manufacturing an all-directions embedded module in accordance with an embodiment of the present disclosure. The example method is provided by way of example, as there are a variety of ways to carry out the method. The method described below can be carried out using the configurations illustrated in FIGS. 2-4, and 6-12, for example, and various elements of these figures are referenced in explaining example method. Each block shown in FIG. 5 represents one or more processes, methods, or subroutines, carried out in the example method. Additionally, the illustrated order of blocks is by example only and the order of the blocks can change. The example method can begin at block 301.

Figure 6:
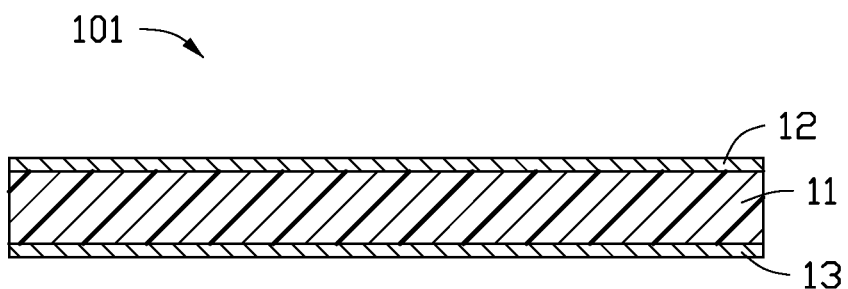
FIG. 6 is a cross-sectional view of a double-sided copper clad substrate.

At block 301, referring to FIG. 6, a double-sided copper clad laminate 101 is provided. The double-sided copper clad laminate 101 includes a first dielectric layer 11, a first copper layer 12, and a second copper layer 13. The first copper layer 12 and the second copper layer 13 are respectively formed on two opposite surfaces of the first dielectric layer 11.

Figure 7:
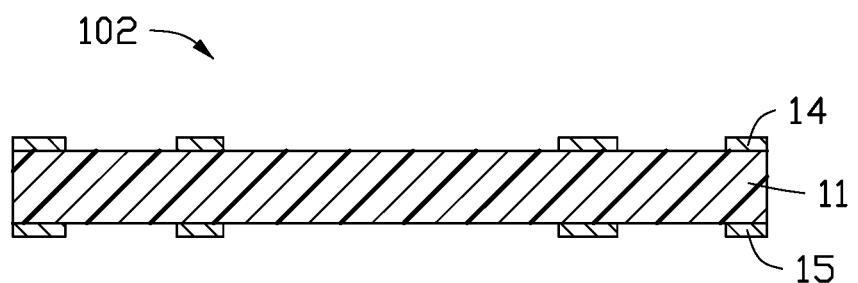
FIG. 7 is a cross-sectional view showing a first inner circuit layer is formed from a first copper layer of the double-sided copper clad laminate of FIG. 6, and a second inner circuit layer is formed from a second copper layer of the double-sided copper clad laminate of FIG. 6.

At block 302, referring to FIG. 7, a first inner circuit layer 14 is formed from a first copper layer 12, and a second inner circuit layer 15 is formed from a second copper layer 13, thereby obtaining an inner circuit substrate 102.

In other embodiments, the inner circuit substrate 102 can further includes more substrate layer and more inner circuit layers.

Figure 8:
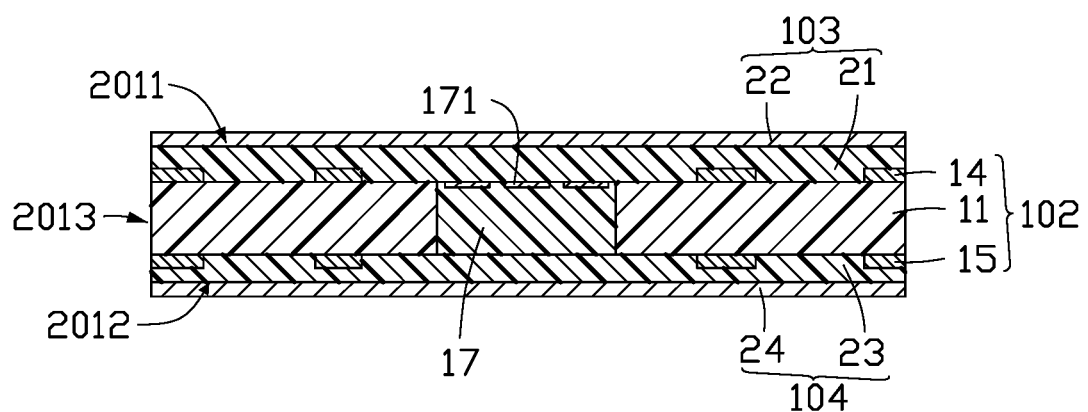
FIG. 8 is a cross-sectional view showing a component is embedded in a substrate layer of the copper clad laminate of FIG. 7, a first single-sided copper clad laminate is formed on the inner first circuit layer of FIG. 7, and a second single-sided copper clad laminate is formed on the second inner circuit layer of FIG. 7.

At block 303, referring to FIG. 8, a through groove 16 is defined in the first dielectric layer 11, a component 17 is embedded in the through groove 16, a first single-sided copper clad laminate 103 and a second single-sided copper clad laminate 104 are formed on two opposite surface of the first dielectric layer 11.

The first single-sided copper clad laminate 103 includes a second dielectric layer 21 formed on the first dielectric layer 11 and a first outer copper layer 22 formed on the second dielectric layer 21. In at least one embodiment, the first inner circuit layer 14 is embedded in the second dielectric layer 21.

The second single-sided copper clad laminate 104 includes a third dielectric layer 23 formed on the first dielectric layer 11 and a second outer copper layer 24 formed on the third dielectric layer 23. In at least one embodiment, the second inner circuit layer 15 is embedded in the third dielectric layer 23.

The first dielectric layer 11, the second dielectric layer 21, and the third dielectric layer 23 constitute an substrate layer 201. The component 17 is embedded in the substrate layer 201.

Figure 9:
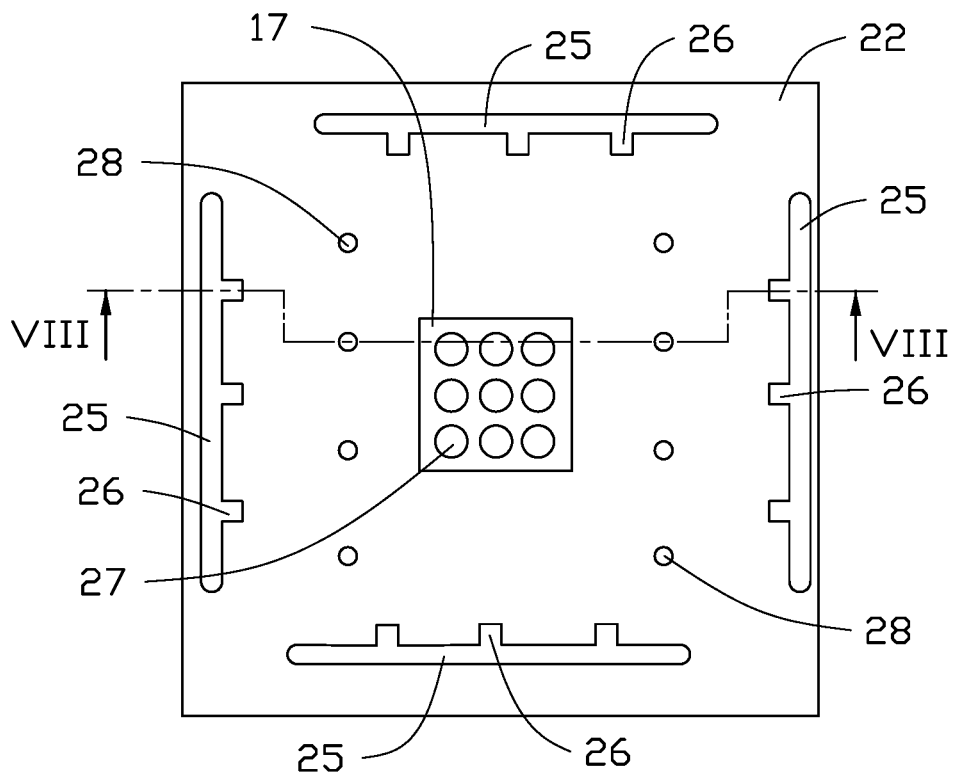
FIG. 9 is a top view showing a plurality of through grooves, a plurality of first through holes, a plurality of blind holes, and a plurality of second through holes are defined from a first outer copper layer of the first single-sided copper clad laminate to a second outer copper layer of the second single-sided copper clad laminate.
Figure 10:
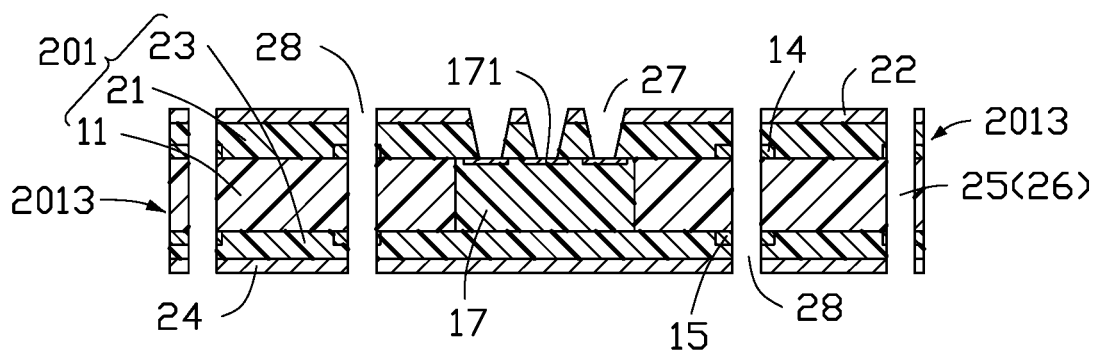
FIG. 10 is a cross-sectional view along line VIII-VIII of FIG. 9.

At block 304, referring to FIGS. 9-10, a plurality of through grooves 25, a plurality of first through holes 26, a plurality of blind holes 27, and a plurality of second through holes 28 are defined from the first outer copper layer 22 to the second outer copper layer 24.

The plurality of through grooves 25, the plurality of first through holes 26, and the plurality of second through holes 28 are all penetrate through the first outer copper layer 22, the substrate layer 201, the second outer copper layer 24, the first inner circuit layer 14, and the second inner circuit layer 15. The plurality of blind holes 27 penetrates through the first outer copper layer 22 and the second dielectric layer 21. The plurality of electrodes 171 of the component 17 exposes from the plurality of blind holes 27.

The plurality of through grooves 25 abuts the plurality of side surfaces 2013. Each of the plurality of through grooves 25 corresponds to one of the plurality of side surfaces 2013.

The plurality of first through holes 26 is connected to one of the plurality of through grooves 25. That is, a plurality of first through holes 26 is located on one side of one of the plurality of through grooves 25. The plurality of through grooves 25 and the plurality of first through holes 26 surround the component 17. The plurality of first through holes 26 is located between the plurality of through grooves 25 and the plurality of blind holes 27. The plurality of second through holes 28 is located between the plurality of first through holes 26 and the plurality of blind holes 27.

Figure 11:
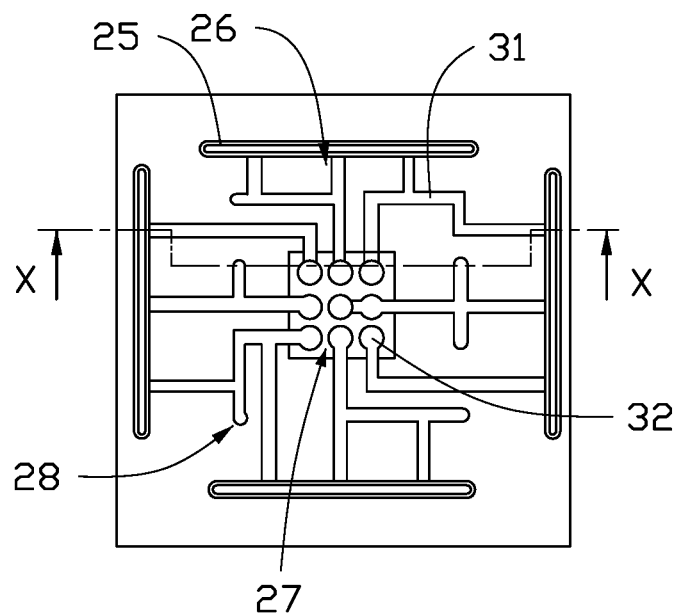
FIG. 11 is a top view of a plurality of first conductive holes, a plurality of second conductive holes, a plurality of third conductive holes, and a plurality of fourth conductive holes are formed by plating a copper on inner walls of the plurality of through grooves, the plurality of first through holes, the plurality of blind holes, and the plurality of second through holes; a first outer circuit layer and a second outer circuit layer are respectively formed from the first outer copper layer and the second outer copper layer.
Figure 12:
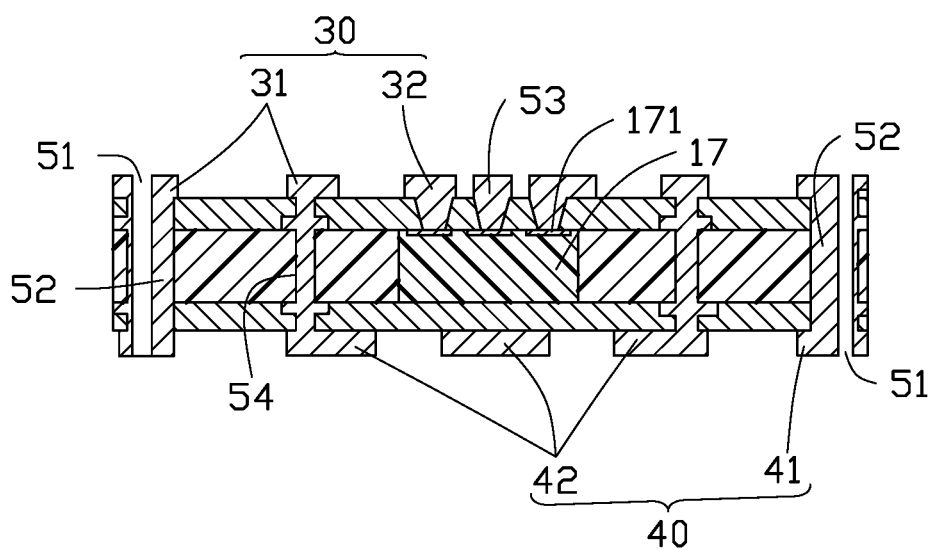
FIG. 12 is a cross-sectional view along line X-X of FIG. 11.

At block 305, referring to FIGS. 11-12, a plurality of first conductive holes 51, a plurality of second conductive holes 52, a plurality of third conductive holes 53, and a plurality of fourth conductive holes 54 are formed by plating a copper in the plurality of through grooves 25, the plurality of first through holes 26, the plurality of blind holes 27, and the plurality of second through holes 28. A first outer circuit layer 30 and a second outer circuit layer 40 are respectively formed from the first outer copper layer 22 and the second outer copper layer 24.

The component 17 has a plurality of electrodes 171. The first outer circuit layer 30 includes a plurality of first connecting circuits 31 and a plurality of first embedded pads 32. In at least one embodiment, the plurality of first embedded pads 32 is connected to the plurality of second conductive holes 52 by the plurality of first connecting circuits 31. The plurality of first embedded pads 32 is electrically connected to the component 17 by the plurality of third conductive holes 53. In detail, the plurality of first embedded pads 32 is electrically connected to the plurality of electrodes 171 of the component 17 by a plurality of third conductive holes 53.

The second outer circuit layer 40 includes a plurality of second connecting circuits 41 and a plurality of second embedded pads 42. The plurality of second embedded pads 42 is electrically connected to the plurality of second conductive holes 52 by the plurality of second connecting circuits 41. The plurality of first connecting circuits 31 is electrically connected to the plurality of second embedded pads 42 by the plurality of fourth conductive holes 54.

At block 306, referring to FIGS. 2-4, a portion of the coppers in the plurality of first through holes 26 are exposed by cutting from an inner wall of the plurality of first through holes 26 to obtaining an all-directions embedded module 10. The coppers in the plurality of first through holes 26 are named a plurality of side wall circuits 61.

Figure 13:
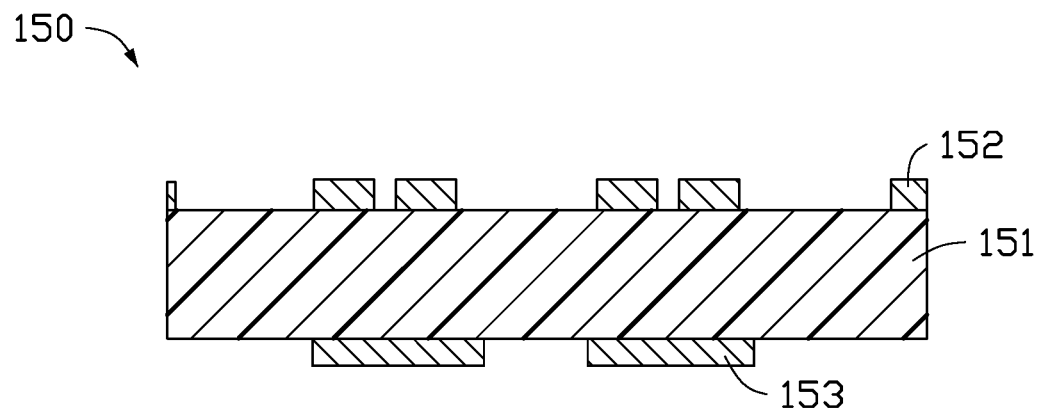
FIG. 13 is a cross-sectional view of a mainboard.

At block 400, referring to FIG. 13, a mainboard 150 is provided.

The mainboard 150 supports and determines a position for the all-directions embedded module 10. In detail, the mainboard 150 includes a main substrate layer 151, a plurality of first main pads 152, and a plurality of second main pads 153. The plurality of first main pads 152 and the plurality of second main pads 153 are formed on two opposite surfaces of the mainboard 150. The plurality of first main pads 152 and the plurality of second main pads 153 determine positions for the all-directions embedded modules 10.

In other embodiments, the plurality of second main pads 153 can be omitted.

Figure 14:
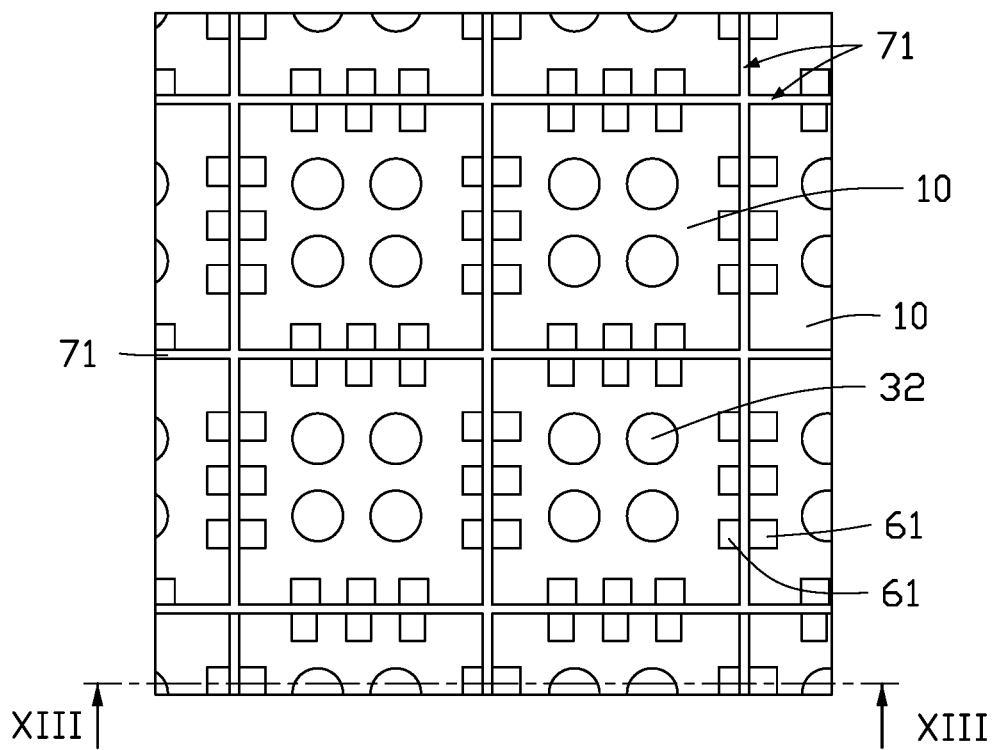
FIG. 14 is a top view showing a plurality of all-directions embedded modules is formed on all-directions embedded modules the mainboard in order (only with side wall circuits and a parts of welding pads), the plurality of all-directions embedded modules is named a first array layer.
Figure 15:
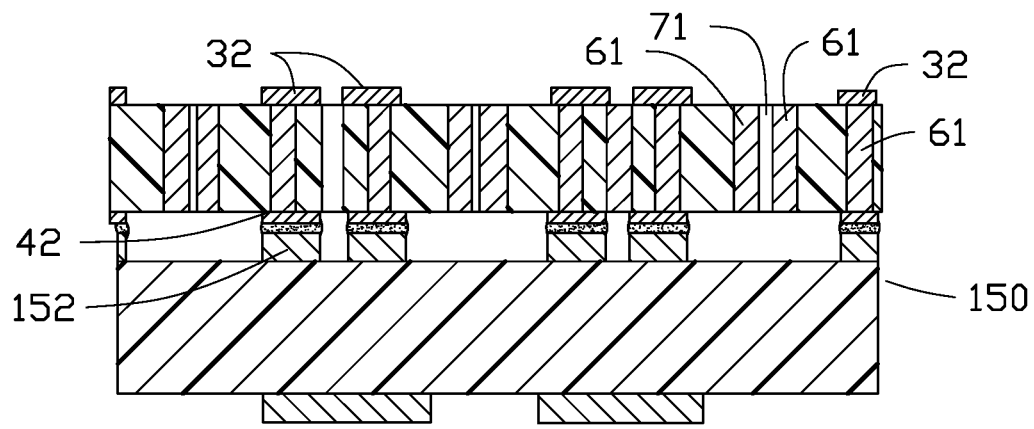
FIG. 15 is a cross-sectional view along line XIII-XIII of FIG. 14.
Figure 16:
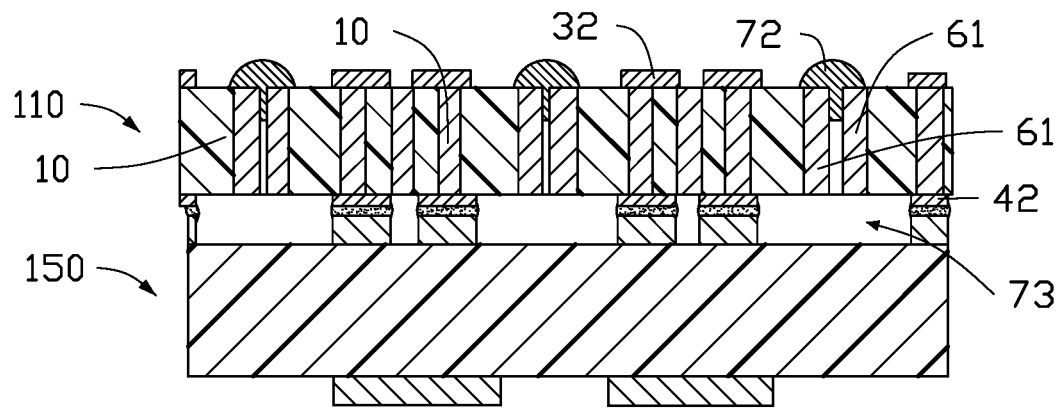
FIG. 16 is a cross-sectional view showing conductive material is filled in first gaps between two of the all-directions embedded modules.

At block 500, referring to FIGS. 14-16, a first array layer 110 is formed on and electrically connected to the mainboard 150. The first array layer 110 includes many all-directions embedded modules 10. The all-directions embedded modules 10 are formed on the mainboard 150 in order. The plurality of second embedded pads 42 of the all-directions embedded modules 10 is electrically connected to the plurality of first main pads 152 of the mainboard 150. Two of the plurality of side wall circuits 61 of two adjacent all-directions embedded modules 10 facing each other are electrically connected to each other.

In detail, two of the plurality of side wall circuits 61 of two adjacent all-directions embedded modules 10 facing each other are electrically connected to each other by filling conductive materials 72 into first gaps 71 between the all-directions embedded modules 10 abutting to each other. In at least one embodiment, the conductive materials 72 are solders. In other embodiments, the conductive materials 72 also can be plating copper, conductive paste, or the like.

Figure 17:
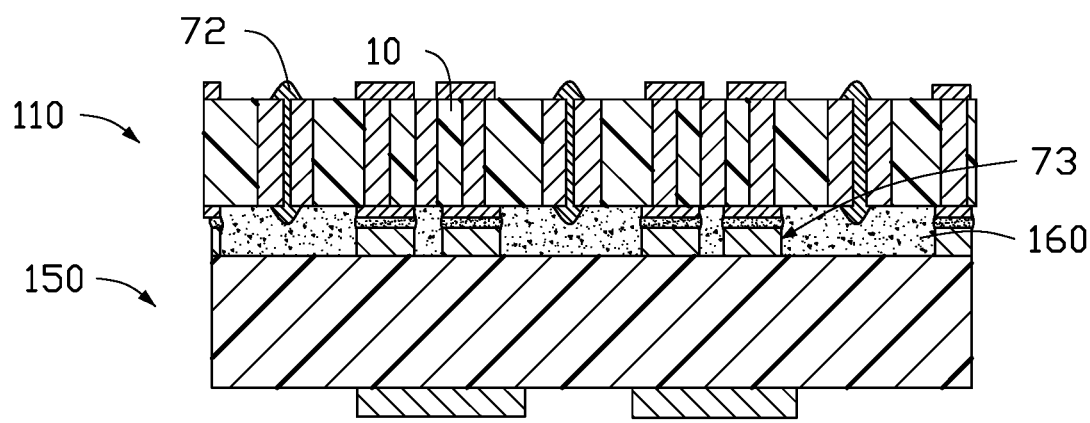
FIG. 17 is a cross-sectional view showing a sealing layer is filled in second gaps between the all-directions embedded modules and the mainboard.

At block 600, referring to FIG. 17, a sealing layer 160 is provided and filled in second gaps 73 between the first array layer 110 and the mainboard 150. The conductive materials 72 is flow-filled in the second gaps 73.

Figure 18:
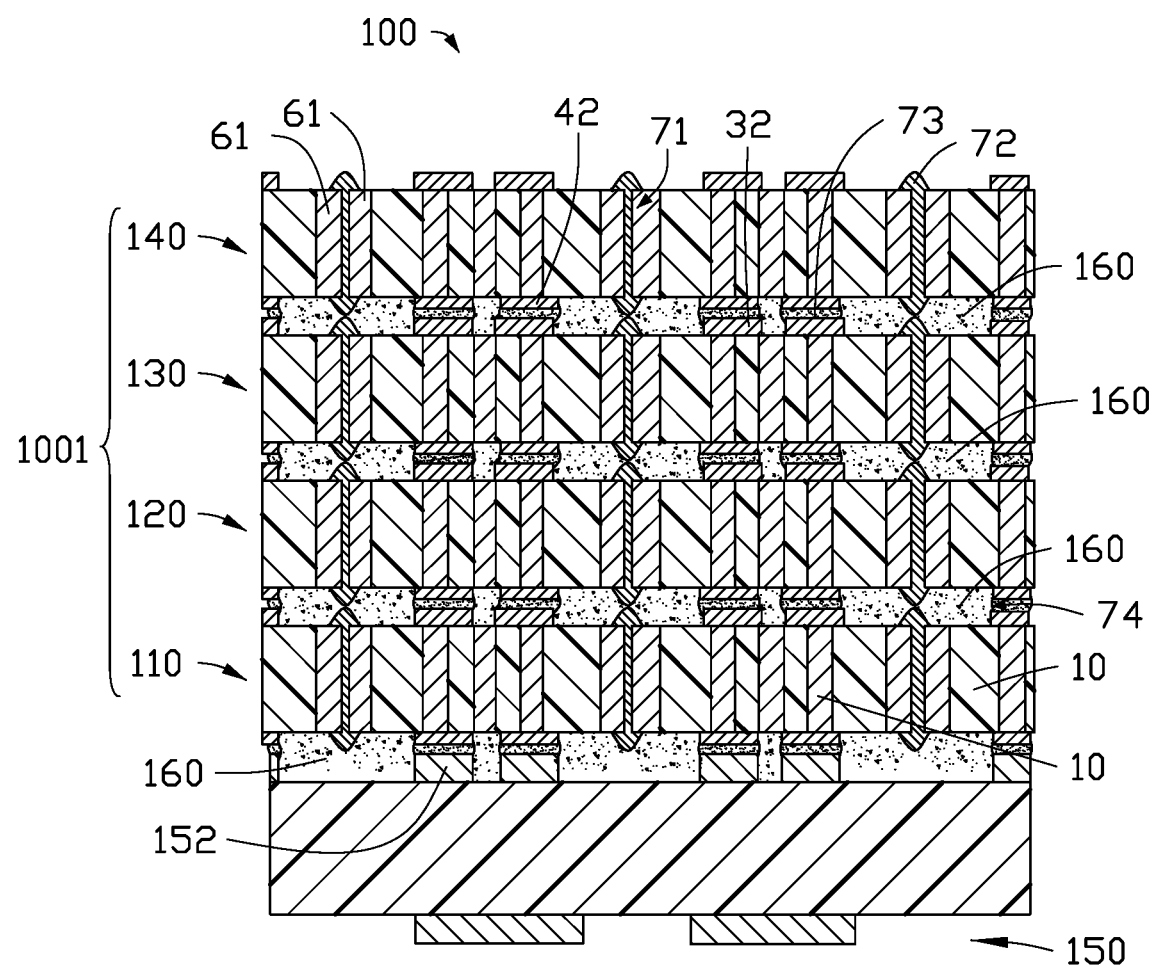
FIG. 18 is a cross-sectional view showing a second array layer is formed on the first array layer, a third array layer is formed on the second array layer, and a fourth array layer is formed on the third array layer to form a packaging structure.

At block 700, referring to FIG. 18, a second array layer 120 is formed on the first array layer 110 to form an all-directions embedded module array 1001, the sealing layer 160 is filled in third gaps 74 between the second array layer 120 and the first array layer 110, thereby obtaining a packaging structure 100.

The second array layer 120 includes many all-directions embedded modules 10. The all-directions embedded modules 10 are formed on the second array layer 120 in order. The plurality of second embedded pads 42 of the all-directions embedded modules 10 in the second array layer 120 is electrically connected to the plurality of first embedded pads 32 of the all-directions embedded modules 10 in the first array layer 110. The plurality of side wall circuits 61 of the all-directions embedded modules 10 abutting to each other are electrically connected to each other.

In at least one embodiment, the all-directions embedded module array 1001 further incudes a third array layer 130 formed on the second array layer 120 and a fourth array layer 140 formed on the third array layer 130. The third array layer 130 includes many all-directions embedded modules 10. The fourth array layer 140 includes many all-directions embedded modules 10. The all-directions embedded modules 10 are formed on the third array layer 130 in order and formed on the fourth array layer 130 in order. The plurality of second embedded pads 42 of the all-directions embedded modules 10 in the third array layer 130 is electrically connected to the plurality of first embedded pads 32 of the all-directions embedded modules 10 in the second array layer 120. The plurality of second embedded pads 42 of the all-directions embedded modules 10 in the fourth array layer 140 is electrically connected to the plurality of first embedded pads 32 of the all-directions embedded modules 10 in the third array layer 130. The plurality of side wall circuits 61 of the all-directions embedded modules 10 abutting to each other are electrically connected to each other.

In other embodiments, the all-directions embedded module array 1001 can further incudes more array layer including many all-directions embedded modules 10.

In other embodiments, the all-directions embedded module array 1001 can only include the first array layer.

Figure 19:
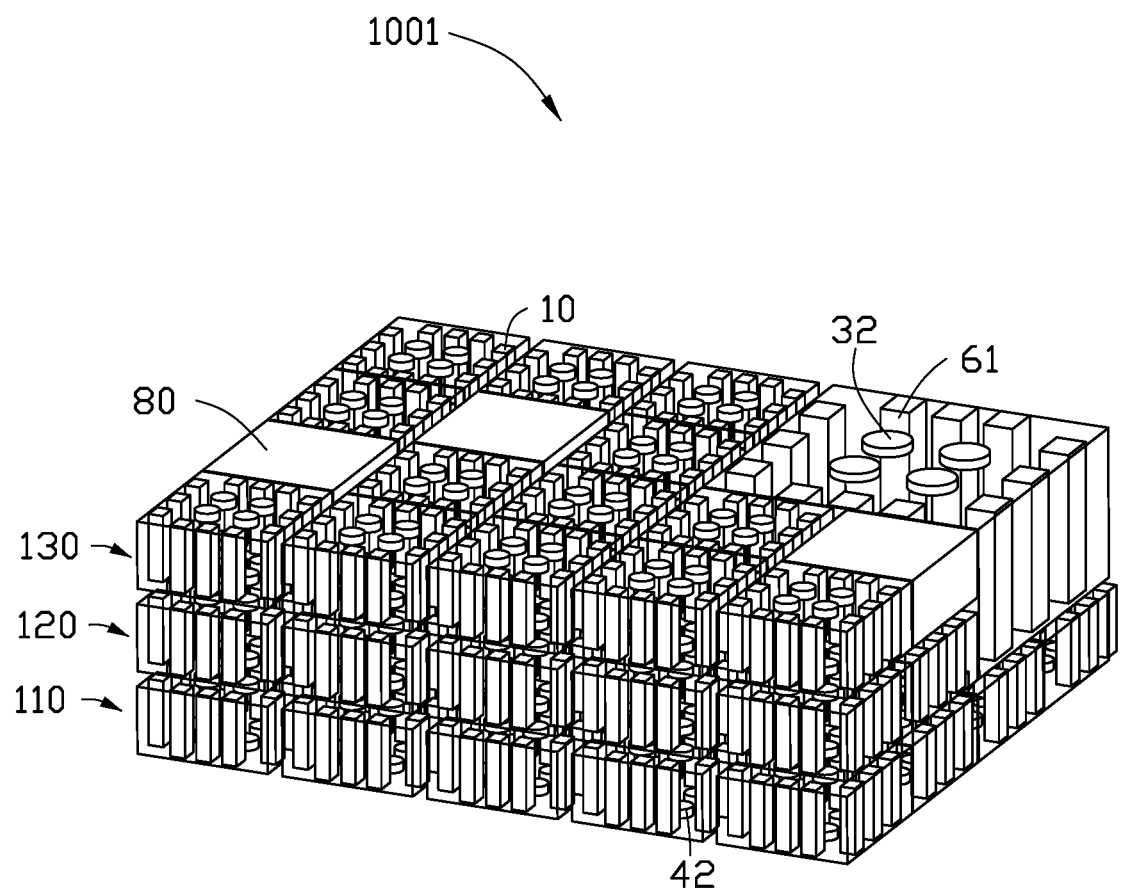
FIG. 19 is a perspective view of the packaging structure (only with side wall circuits and a parts of welding pads).

Referring to FIG. 19, one or more all-directions embedded modules 10 in the all-directions embedded module array 1001 may also be replaced by a passive element 80. In detail, one of the first array layer 110, the second array layer 120, and the third array layer 130 may also be replaced by the passive component 80. That is, the first array layer 110 and/or the second array layer 120 and/or the third array layer 130 may further include a passive component 80. The passive component 80 is electrically connected to any one of the first embedded pads 32, the second embedded pads 42, and the plurality of side wall circuits 61 of the all-directions embedded modules 10.

The all-directions embedded modules 10 in the all-directions embedded module array 1001 may have a different volume.

A number of the all-directions embedded modules 10 in the first array layer 110, the second array layer 120, the third array layer 130, and the fourth array layer 140 may be different.

A number of plurality of first embedded pads 32 and the plurality of second embedded pads 42 may be different.

The packaging structure 100 includes a mainboard 150, an all-directions embedded module array 1001, and a sealing layer 160. The all-directions embedded module array 1001 is formed on the mainboard 150. The sealing layer 160 is filled between the mainboard 150 and the all-directions embedded module array 1001.

The mainboard 150 supports and determines a position for the all-directions embedded module 10. In detail, the mainboard 150 includes a main substrate layer 151, and a plurality of first main pads 152, and a plurality of second main pads 153. The plurality of first main pads 152 and the plurality of second main pads 153 are formed on two opposite surfaces of the mainboard 150. The plurality of first main pads 152 and the plurality of second main pads 153 determine positions for the all-directions embedded modules 10.

In other embodiments, the plurality of second main pads 153 can be omitted.

The all-directions embedded module array 1001 includes a first array layer 110. The first array layer 110 includes many all-directions embedded modules 10. The all-directions embedded modules 10 are formed on the mainboard 150 in order.

The all-directions embedded module 10 includes an substrate layer 201, at least one component 17, a first outer circuit layer 30, a second outer circuit layer 40, and a plurality of side wall circuits 61.

The substrate layer 201 includes a first surface 2011, a second surface opposite to the first surface 2012, and a plurality of side surfaces 2013 connected to the first surface 2011 and the second surface 2012. The component 17 is embedded in the substrate layer 201. The first outer circuit layer 30 is formed on the first surface 2011. The second outer circuit layer 40 is formed on the second surface 2012. The plurality of side wall circuits 61 is embedded in the substrate layer 201 and exposed from the plurality of side surfaces 2013.

The substrate layer 201 further includes a second dielectric layer 21, a first dielectric layer 11, and a third dielectric layer 23 successively stacked together. The component 17 is received in the first dielectric layer 11. The second dielectric layer 21 and the third dielectric layer 23 are respectively formed on two opposite surfaces of the first dielectric layer 11. The second dielectric layer 21 and the third dielectric layer 23 cover the component 17. The first dielectric layer 11 matches the second dielectric layer 21 and the third dielectric layer 23 to embed the component 17 in the substrate layer 201.

The component 17 has a plurality of electrodes 171.

The first outer circuit layer 30 includes a plurality of first connecting circuits 31 and a plurality of first embedded pads 32. In at least one embodiment, the plurality of first embedded pads 32 is connected to the plurality of side wall circuits 61 by the plurality of first connecting circuits 31. The plurality of first embedded pads 32 is connected to the component 17.

The second outer circuit layer 40 includes a plurality of second connecting circuits 41 and a plurality of second embedded pads 42. The plurality of second embedded pads 42 is connected to the plurality of side wall circuits 61 by the plurality of second connecting circuits 41.

The all-directions embedded module 10 further includes a plurality of third conductive holes 53 and a plurality of fourth conductive holes 54. The first outer circuit layer 30 is connected to the second outer circuit layer 40 by the plurality of fourth conductive holes 54. In detail, the plurality of first connecting circuits 31 is connected to the plurality of second embedded pads 42 by the plurality of fourth conductive holes 54. The plurality of first embedded pads 32 is connected to the plurality of electrodes 171 of the component 17 by the plurality of third conductive holes 53.

The all-directions embedded module 10 further includes a first inner circuit layer 14 and a second inner circuit layer 15. The first inner circuit layer 14 and the second inner circuit layer 15 are respectively formed on two opposite surfaces of the first dielectric layer 11 and embedded in the second dielectric layer 21 and the third dielectric layer 23.

The plurality of second embedded pads 42 in the all-directions embedded modules 10 is electrically connected to the plurality of first main pads 152 in the mainboard 150. Two of the plurality of side wall circuits 61 of two adjacent all-directions embedded modules 10 facing each other are electrically connected to each other.

The sealing layer 160 is filled in second gaps 73 between the first array layer 110 and the mainboard 150. The conductive materials 72 is flow-filled in the second gaps 73.

In at least one embodiment, the all-directions embedded module array 1001 further includes a second array layer 120 formed on the first array layer 110, a third array layer 130 formed on the second array layer 120 and a fourth array layer 140 formed on the third array layer 130.

The second array layer 120 includes many all-directions embedded modules 10. The all-directions embedded modules 10 are formed on the second array layer 120 in order. The plurality of second embedded pads 42 of the all-directions embedded modules 10 in the second array layer 120 is electrically connected to the plurality of first embedded pads 32 of the all-directions embedded modules 10 in the first array layer 110. Two of the plurality of side wall circuits 61 of two adjacent all-directions embedded modules 10 facing each other are electrically connected to each other.

The third array layer 130 includes many all-directions embedded modules 10. The fourth array layer 140 includes many all-directions embedded modules 10. The all-directions embedded modules 10 are formed on the third array layer 130 in order and formed on the fourth array layer 130 in order.

The plurality of second embedded pads 42 of the all-directions embedded modules 10 in the third array layer 130 is electrically connected to the plurality of first embedded pads 32 of the all-directions embedded modules 10 in the second array layer 120. The plurality of second embedded pads 42 of the all-directions embedded modules 10 in the fourth array layer 140 is electrically connected to the plurality of first embedded pads 32 of the all-directions embedded modules 10 in the third array layer 130. Two of the plurality of side wall circuits 61 of two adjacent all-directions embedded modules 10 facing each other are electrically connected to each other.

In other embodiments, the all-directions embedded module array 1001 can further incudes more array layer including many all-directions embedded modules 10.

In other embodiments, the all-directions embedded module array 1001 can only include the first array layer.

Referring to FIG. 19, one or more all-directions embedded modules 10 in the all-directions embedded module array 1001 may also be replaced by a passive element 80.

In detail, one of the first array layer 110, the second array layer 120, and the third array layer 130 may also be replaced by the passive component 80. That is, the first array layer 110 and/or the second array layer 120 and/or the third array layer 130 may further include at least one passive component 80. The passive component 80 is electrically connected to any one of the first embedded pads 32, the second embedded pads 42, and the plurality of side wall circuits 61 of the all-directions embedded modules 10.

The all-directions embedded modules 10 in the all-directions embedded module array 1001 may have a different volume.

A number of the all-directions embedded modules 10 in the first array layer 110, the second array layer 120, the third array layer 130, and the fourth array layer 140 may be different.

A number of plurality of first embedded pads 32 and the plurality of second embedded pads 42 may be different.

With the above configuration, the all-directions embedded module 10 includes an substrate layer 201, the substrate layer 201 includes a first surface 2011, a second surface 2012 opposite to the first surface 2012, and a plurality of side surfaces 2013 connected to the first surface 2011 and the second surface 2012. A plurality of first embedded pads 32 is formed on the first surface 2011, a plurality of second embedded pads 42 is formed on the second surface 2012, and a plurality of side wall circuits 61 is embedded in the substrate layer 201 and exposed from the plurality of side surfaces 2013, thereby the all-directions embedded module 10 can be conducted in all directions. Many of the all-directions embedded modules 10 are arranged and packaged on a mainboard 150 in a modular way, thereby greatly improving signal transmission paths of the packaging structure 100. The all-directions embedded modules 10 do not need to be encapsulated in an insulating substrate, so there is no need to form an embedded cavity, so a packaging process can be reduced. A number of the all-directions embedded modules 10 can be increased in various directions according to actual needs, so that a packaging flexibility of the packaging structure 100 can be greatly improved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing an all-directions embedded module, comprising:

providing an inner circuit substrate, wherein the inner circuit substrate comprises a first substrate layer; and the first substrate layer comprises a plurality of side surfaces;

forming a first single-sided copper clad laminate and a second single-sided copper clad laminate on two opposite surface of the first substrate layer; wherein the first single-sided copper clad laminate comprises a first outer copper; and the second single-sided copper clad laminate comprises a second outer copper;

defining a plurality of through grooves and a plurality of first through holes from the first outer copper layer to the second outer copper layer; wherein the plurality of through grooves are connected with the plurality of first through holes; the plurality of through grooves abuts the plurality of side surfaces;

plating copper in the plurality of through grooves and the plurality of first through holes; and forming a first outer circuit layer and a second outer circuit layer from the first outer copper and the second outer copper; the first outer circuit layer comprises a plurality of first embedded pads; the second outer circuit layer comprises a plurality of second embedded pads; and exposing a portion of the copper in the plurality of first through holes by cutting from an inner walls of the plurality of through grooves; the copper exposed in the plurality of first through holes formed a plurality of side wall circuits; the plurality of side wall circuits are electrically connected to the plurality of first embedded pads and the plurality of second embedded pads.

2. The method of claim 1, wherein at least one component is embedded in the first substrate layer; further comprises:

defining a plurality of blind holes from the first outer copper layer to the second outer copper layer; and plating copper in the plurality of blind holes to form a plurality of third conductive holes; the plurality of first embedded pads are electrically connected to the component.

3. The method of claim 2, further comprising:

defining a plurality of second through holes from the first outer copper layer to the second outer copper layer; and plating the copper in the plurality of second through holes to form a plurality of fourth conductive holes.

4. The method of claim 3, wherein the plurality of first through holes are located between the plurality of through grooves and the plurality of blind holes.

5. The method of claim 3, wherein the plurality of second through holes are located between the plurality of first through holes and the plurality of blind holes.

6. The method of claim 1, wherein the first outer circuit layer further comprises a plurality of first connecting circuits, the plurality of first embedded pads are electrically connected to the plurality of side wall circuits by the plurality of first connecting circuits.

7. The method of claim 1, wherein the second outer circuit layer comprises a plurality of second connecting circuits, the plurality of second embedded pads are electrically connected to the plurality of side wall circuits by the plurality of second connecting circuits.

* * * * *